United States Patent
Ichinose et al.

(10) Patent No.: US 8,944,616 B2
(45) Date of Patent: Feb. 3, 2015

(54) DISPLAY DEVICE AND IMAGE-INFORMATION PROCESSING APPARATUS EQUIPPED WITH THE SAME

(75) Inventors: Yuushi Ichinose, Yokohama (JP); Atsushi Shiozaki, Mobara (JP); Kiyofumi Sakaguchi, Miura-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 206 days.

(21) Appl. No.: 13/533,195

(22) Filed: Jun. 26, 2012

(65) Prior Publication Data

US 2013/0002690 A1 Jan. 3, 2013

(30) Foreign Application Priority Data

Jun. 30, 2011 (JP) ................... 2011-146516

(51) Int. Cl.
*F21V 9/14* (2006.01)
*H01L 51/52* (2006.01)
*H01L 27/32* (2006.01)

(52) U.S. Cl.
CPC ........ *H01L 51/5275* (2013.01); *H01L 51/5284* (2013.01); *H01L 27/3244* (2013.01)
USPC ................. 362/19; 362/84; 362/237

(58) Field of Classification Search
CPC ........ H05B 33/28; H05B 33/14; C09K 11/06; H01L 2251/5315
USPC ............................... 362/19, 84, 237
See application file for complete search history.

(56) References Cited

U.S. PATENT DOCUMENTS

2005/0057176 A1* 3/2005 Lu et al. .................. 315/169.3
2009/0073691 A1 3/2009 Shibasaki et al.

FOREIGN PATENT DOCUMENTS

| | | |
|---|---|---|
| CN | 1534988 A | 10/2004 |
| CN | 1612660 A | 5/2005 |
| CN | 1665361 A | 9/2005 |
| CN | 1967899 A | 5/2007 |
| CN | 101533850 A | 9/2009 |
| JP | 2003-291406 A | 10/2003 |
| JP | 2004-039500 A | 2/2004 |
| JP | 2004-127661 A | 4/2004 |
| JP | 2004-205849 A | 7/2004 |

* cited by examiner

*Primary Examiner* — Sean Gramling
(74) *Attorney, Agent, or Firm* — Canon USA Inc IP Division

(57) ABSTRACT

An optical absorption layer having a plurality of openings corresponding to lenses is provided between a lens array and a first electrode. An edge of each of the openings is provided such that light entering in a normal direction of a substrate and traveling through an area where the corresponding lens has a maximum inclination angle is blocked.

6 Claims, 10 Drawing Sheets

DISPLAY DEVICE AND IMAGE-INFORMATION PROCESSING APPARATUS EQUIPPED WITH THE SAME

BACKGROUND OF THE INVENTION

1. Field of the Invention

The present invention relates to display devices, and particularly, to display devices equipped with light-emitting elements having light-emitting layers and to image-information processing apparatuses equipped with such display devices.

2. Description of the Related Art

Referring to FIG. 13, in a display device (referred to as "organic electroluminescent (EL) display device" hereinafter) equipped with organic EL elements, multiple organic EL elements are generally arranged on a substrate 100 provided with a driving circuit, and the surface of each organic EL element is covered with a protection layer 600. Each organic EL element is constituted of a first electrode 200, a second electrode 500, and an organic compound layer 400 including a light-emitting layer interposed between these electrodes. A light-emitting area of each organic EL element is defined by a partition layer 300. The organic EL elements are covered with the protection layer 600 so as to be protected from degradation caused by moisture and oxygen contained in the external space.

In the display device shown in FIG. 13, light (luminescent light) emitted at various angles from the organic EL elements mainly undergoes total reflection at the boundary between the protection layer 600 and the external space, which is a problem in that half or more of the luminescent light cannot be emitted outward from the organic EL display device. Moreover, in an environment where light (external light) is received from the outside, the external light entering the display device is emitted outward therefrom after being reflected at an interface of a multilayer film or a metal layer constituting the wires in the driving circuit or the first reflective electrodes. Therefore, an observer may observe both the external light reflected within the display device and the luminescent light emitted to the outside, which is a problem in terms of reduced legibility (contrast and view angle characteristics).

For solving these problems, Japanese Patent Laid-Open No. 2004-205849 discloses an organic EL display device in which a lens array constituted of multiple lenses is arranged on the surface of the device, a reflection prevention film is provided over the surface of each lens, and a polarizer is disposed in parallel to the substrate at the light emission side of the lenses. With this configuration, the total reflection occurring at the boundary between the display device and the external space can be reduced by the lens array so as to achieve increased light emission efficiency. In addition, the reflection of external light can also be reduced by the reflection prevention film and the polarizer.

Japanese Patent Laid-Open No. 2004-127661 discloses an organic EL display device equipped with lenses in correspondence with organic EL elements. In this organic EL display device, a black mask having multiple openings in correspondence with the organic EL elements is disposed between a passivation layer and a lens sheet. With this configuration, light emitted from a certain organic EL element is prevented from entering the lens provided in correspondence with an adjacent organic EL element, thereby reducing legibility in directions other than the normal direction of the substrate.

A circular polarization member (polarizer) can quench a component of light passing through the circular polarization member in the normal direction, whether the light be external light entering the display device from the outside or external light reflected within the display device so as to be emitted to the outside again. However, a light component that obliquely passes through the circular polarization member (at an angle relative to the normal direction) or a light component having passed through the circular polarization member at an angle cannot be quenched.

Because a display device is often observed from the front, that is, in the normal direction of the substrate, high legibility in the normal direction is required. In the case of the display device according to Japanese Patent Laid-Open No. 2004-205849, external light incident on the substrate at an angle, that is, external light having passed through the circular polarization member at an angle, due to refraction by the lenses is reflected within the display device so as to be emitted outward in the normal direction of the substrate. When such external light enters the display device, since the external light includes a component of light having passed through the circular polarization member at an angle, the light is emitted outward from the display device in the normal direction without being sufficiently quenched by the circular polarization member, leading to reduced legibility. In other words, in the display device having lenses as discussed in Japanese Patent Laid-Open No. 2004-205849, the external light reflected within the display device cannot be sufficiently suppressed by the polarizer (circular polarization member) alone.

The black mask in Japanese Patent Laid-Open No. 2004-127661 is not positioned in view of suppressing the external light emitted outward in the normal direction of the substrate via the lenses after entering the display device via the lenses and being reflected within the display device.

SUMMARY OF THE INVENTION

According to the present invention, external light incident on a substrate at an angle due to refraction by lenses and reflected within a display device before being emitted outward in the normal direction of the substrate can be reduced, thereby achieving high legibility display for observation from the front of the display device.

In order to solve the aforementioned problems, a display device according to an aspect of the present invention includes a light-emitting-element array including a plurality of light-emitting elements arranged on a substrate, each light-emitting element having a light-emitting layer disposed between a first electrode and a second electrode; and a lens array provided at a light emission side of the light-emitting-element array and including a plurality of lenses arranged in correspondence with the plurality of light-emitting elements. An optical absorption layer having a plurality of openings corresponding to the plurality of lenses is disposed between the lens array and the first electrode. An edge of each of the openings is provided such that light entering in a normal direction of the substrate and traveling through an area where the corresponding lens has a maximum inclination angle is blocked by the optical absorption layer.

According to the present invention, incident light passing through the area with the maximum inclination angle in each micro-lens is absorbed by the optical absorption layer provided between the lens and the first electrode. As a result, the present invention can provide a high-legibility display device that reduces reflection of external light that cannot be quenched by an optical polarization member due to refraction by the lens.

Further features of the present invention will become apparent from the following description of exemplary embodiments with reference to the attached drawings.

DESCRIPTION OF THE EMBODIMENTS

A display device according to the present invention will now be described with reference to the drawings. Although the following description is directed to an example of an organic electroluminescent (EL) display device, light-emitting elements in the display device according to the present invention are not limited to organic EL elements, but may alternatively be inorganic EL elements or light-emitting elements such as LEDs.

Figure 1A:
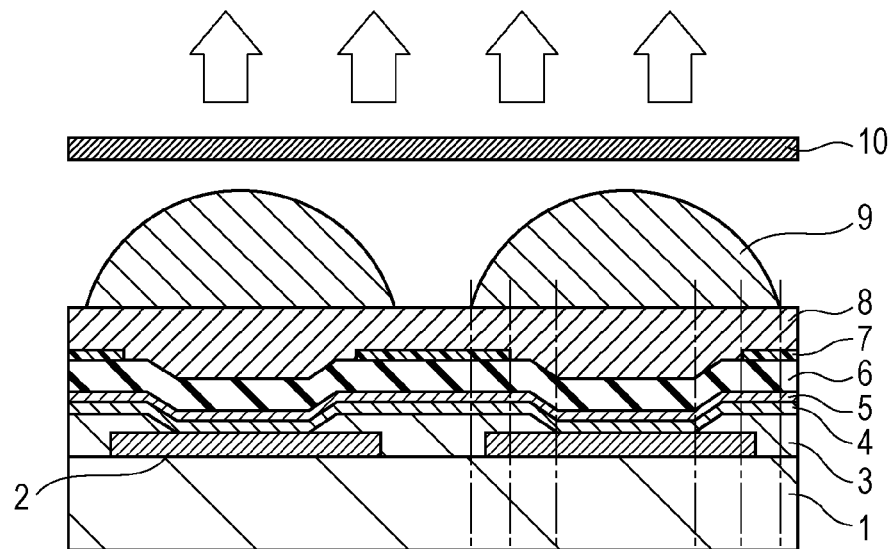
FIGS. 1A and 1B schematically illustrate a display device according to an embodiment of the present invention.
Figure 1B:
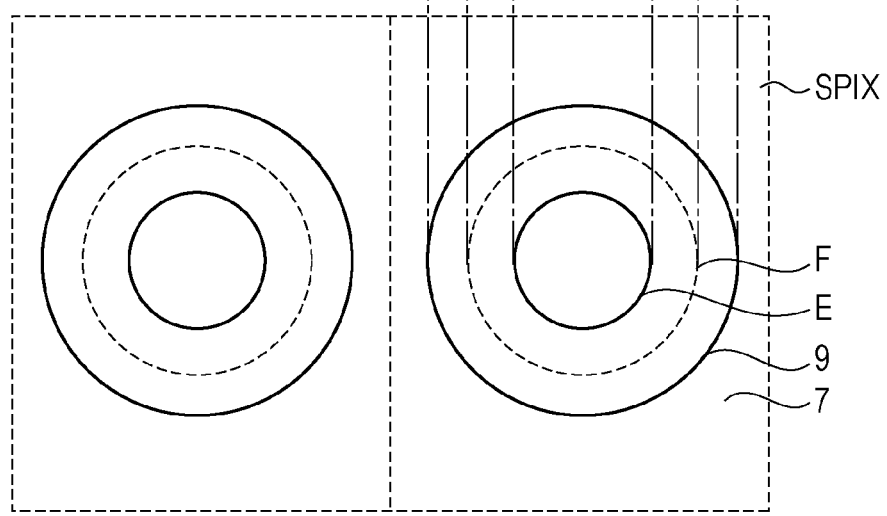

FIGS. 1A and 1B are partial views of a display region of a display device according to an embodiment of the present invention. Specifically, FIG. 1A is a cross-sectional view and FIG. 1B is a top view. First, the configuration of the display device will be described, and a detailed description of an optical absorption layer 7 will be provided later.

First electrodes 2, an organic compound layer 4, and a second electrode 5 are provided in that order on a substrate 1 provided with wires and a driving circuit (not shown) for driving the light-emitting elements. In the present invention, the term "organic EL elements" refers to a structure having the first electrodes 2, the second electrode 5, and the organic compound layer 4 interposed between the first electrodes 2 and the second electrode 5. In FIG. 1B, SPIX is an area allocated to each light-emitting element in the display region of the display device and is called a sub-pixel.

The first electrodes 2 are individual electrodes provided in the respective light-emitting elements. The organic compound layer 4 at least includes a light-emitting layer, and may also include functional layers, such as a hole injection layer, a hole transport layer, an electron transport layer, and an electron injection layer, where necessary, in addition to the light-emitting layer. A known material may be used for forming each of the layers constituting the organic compound layer 4. The second electrode 5 extending continuously across the multiple light-emitting elements (i.e., a light-emitting element array) is provided on the organic compound layer 4 and serves as a common electrode.

Generally, due to being a thin layer with a thickness of about 10 nm to 100 nm, the organic compound layer 4 cannot cover the steps at the edges of the first electrodes 2. This may cause the second electrode 5 and the first electrodes 2 to short-circuit, possibly resulting in an inability for the organic EL elements to emit light. Therefore, it is preferable to provide a partition layer 3 having inclined surfaces that cover the edges of the first electrodes 2. The partition layer 3 has openings each defining a light-emitting area of each light-emitting element. The term "light-emitting area" in this case refers to an area surrounded by a solid line E (denoting an edge of each opening in the partition layer 3). In this embodiment, this area is where the organic compound layer 4 and the corresponding first electrode 2 are in contact with each other.

Although the first electrodes 2 are provided in the respective light-emitting elements, and the second electrode 5 is provided as a common electrode for the light-emitting element array, the embodiment is not limited to this configuration so long as the light-emitting elements can be driven individually. For each of the first electrodes 2 and the second electrode 5, a material with good carrier injection properties relative to the organic compound layer 4 is selected. Moreover, of the first electrode 2 and the second electrode 5 in each sub-pixel SPIX, the electrode located at the light emission side is formed of a transparent or semi-transparent film, such as an indium tin oxide (ITO) film, an indium zinc oxide film, or a thin metal film with a thickness of about 1 nm to 10 nm. The other electrode is preferably a reflective electrode so that light emitted from within the organic compound layer 4 and traveling toward the substrate 1 is output toward the emission side. For the reflective electrode, a single layer composed of metal with high reflectivity, such as Ag or Al, or a laminated body including a metal layer and a transparent conductive layer composed of ITO or indium zinc oxide may be used. In this case, the term "transparent" refers to characteristics having a transmittance of 80% or higher relative to visible light, and the term "semi-transparent" refers to characteristics that transmit a portion of light and reflect the remaining portion, and have a reflectivity higher than 20% but lower than 80% relative to visible light. The term "reflective" refers to characteristics having a reflectivity of 80% or higher relative to visible light. Since the display device in FIG. 1A is of a top emission type that emits light in a direction (indicated by arrows) opposite the substrate 1, the first electrodes 2 are reflective, whereas the second electrode 5 is transparent or semi-transparent.

A protection layer 6 that prevents moisture and oxygen from entering the light-emitting elements is provided on the second electrode 5, and the optical absorption layer 7 having openings in correspondence with the light-emitting areas of the light-emitting elements are provided on the protection layer 6. In this case, each of the openings is an area surrounded by a dotted line F, which is where the optical absorption layer 7 is not provided. The dotted line F in FIG. 1B denotes the edge of each opening provided in the optical absorption layer 7. The protection layer 6 may be composed of, for example, an inorganic insulation material, such as silicon nitride or silicon oxynitride, or may be formed of a laminated body including an inorganic insulation material and an organic insulation material, but in the case of a top-emission-type display device, a transparent material is selected. The optical absorption layer 7 is composed of a resin material mixed with a colorant, such as carbon particles, so as to be given a black color or a nearly black color. The optical absorbance in each visible-light area of the optical absorption layer 7 is preferably 90% or higher, or more preferably, 95% or higher.

An undercoating layer 8 is formed above the protection layer 6 and the optical absorption layer 7. When a surface to be provided with a lens array (i.e., lens formation surface) is composed of multiple materials, such as the protection layer 6 and the optical absorption layer 7, there is a possibility that the lenses may become uneven in shape due to different wettability between the lens formation surface and the resin material. Therefore, the undercoating layer 8 is provided so as to form the lens formation surface with a uniform material, thereby reducing variations in the shape of micro-lenses. At the same time, the shape of the lenses can be made even more uniform by planarizing the lens formation surface with the undercoating layer 8.

Multiple lenses 9, that is, a lens array, are arranged at the light emission side of the undercoating layer 8. In this case, the center of each lens 9 is preferably aligned with the center of the corresponding light-emitting area in the normal direction. At the light emission side of the lenses 9, a circular polarization member 10 is provided in parallel to the substrate 1. Although the circular polarization member 10 may be of a known type, a multilayer circular polarization member having a phase difference member and a linear polarization member stacked in that order from the lens side is preferred.

Next, the position and advantages of the optical absorption layer 7 in the display device equipped with the lens array will be described in detail with reference to FIGS. 2A and 2B.

Figure 2A:
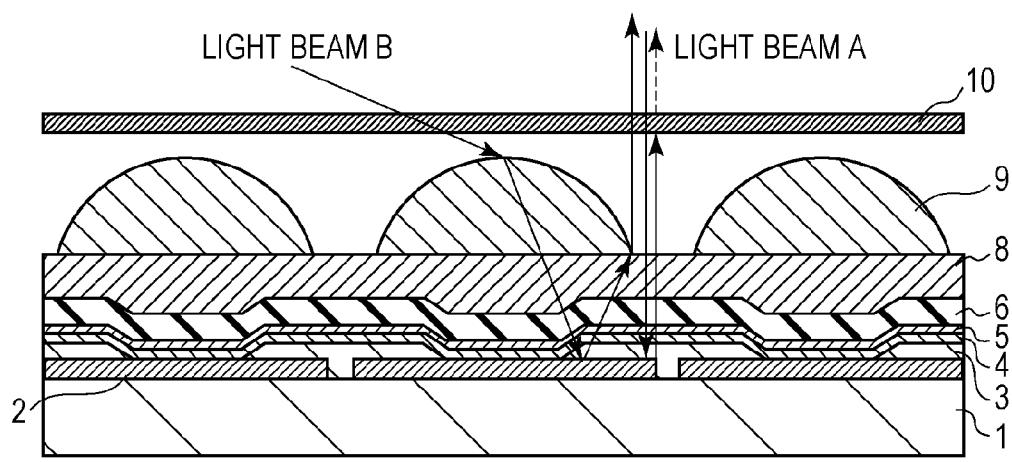
FIGS. 2A and 2B are schematic cross-sectional views for explaining the advantages of an optical absorption layer in the embodiment shown in FIGS. 1A and 1B.
Figure 2B:
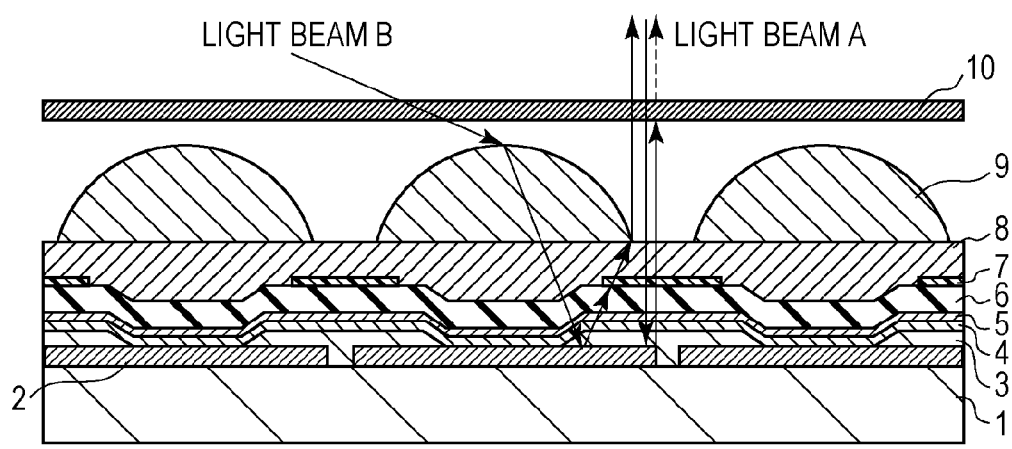

FIG. 2A schematically illustrates paths of external light entering a display device provided with the lenses 9 but not provided with the optical absorption layer 7. External light refracted at the surfaces of the lenses 9 and entering the display device is reflected by the reflective electrodes within the display device and by the surfaces of wires formed in the metal layer located in the same layer as or below the reflective electrodes, and is refracted again by the surfaces of the lenses 9 before being emitted outward. A light beam A denotes a path of external light entering the display device in the normal direction of the substrate 1, reflected within the display device, and subsequently emitted outward in the normal direction of the substrate 1. A light beam B denotes a path of external light entering the display device at an angle toward the substrate 1, reflected within the display device, and subsequently emitted outward in the normal direction of the substrate 1. In this manner, in addition to the light beam A entering the display device in the normal direction of the substrate 1 being emitted outward in the normal direction of the substrate 1, the light beam B entering the display device at an angle is also emitted outward in the normal direction of the substrate 1. This is due to the lenses 9 having non-uniform inclination angles. The inclination angle of each lens 9 is an angle formed between the surface of the substrate 1 and a plane in contact with a specific point on the lens surface.

Because the light beam A enters the display device in the normal direction of the substrate 1, the light quantity of the light beam A is substantially reduced by half since the light beam A is absorbed by the circular polarization member 10 as it travels through the circular polarization member 10 in the normal direction. In addition, the light traveling through the circular polarization member 10 is circularly polarized in the clockwise direction or the counterclockwise direction depending on the characteristics of the circular polarization member 10. Subsequently, the light is reflected within the display device so as to become circularly-polarized in the opposite direction, and is then emitted in the normal direction of the substrate 1. The light beam A emitted in the normal direction of the substrate 1 is substantially absorbed by the circular polarization member 10 as it travels through the circular polarization member 10 again in the normal direction. In other words, external light, like the light beam A, which enters the display device in the normal direction of the substrate 1 and is reflected in the normal direction of the substrate 1 within the display device can be substantially quenched since the light always travels through the circular polarization member 10 in the normal direction.

On the other hand, because the light beam B enters the display device at an angle toward the substrate 1, the light beam B travels obliquely through the circular polarization member 10. In this case, a portion of the light is absorbed by the circular polarization member 10 in accordance with the incident angle, while the remaining portion passes through the circular polarization member 10. The light having passed through the circular polarization member 10 includes circularly-polarized light and non-circularly-polarized light. In this case, the larger the incident angle, the greater the proportion of light passing through the circular polarization member 10 without being absorbed by the circular polarization member 10, thus also resulting in a greater proportion of non-circularly-polarized light. The light having passed through the circular polarization member 10 is refracted by each lens 9 so as to enter the display device. Then, the light is reflected within the display device, is refracted by the lens 9, is emitted in the normal direction of the substrate 1, and then travels through the circular polarization member 10 again in the normal direction. Of the light traveling again through the circular polarization member 10, since the circularly-polarized light is circularly-polarized in the opposite direction due to being reflected within the display device, the circularly-polarized light is absorbed by the circular polarization member 10 as it travels therethrough. However, the non-circularly-polarized light is directly emitted outward without being absorbed by the circular polarization member 10. Therefore, the external light entering the display device at an angle, like the light beam B, cannot be quenched sufficiently with the circular polarization member 10 alone.

Figure 3:
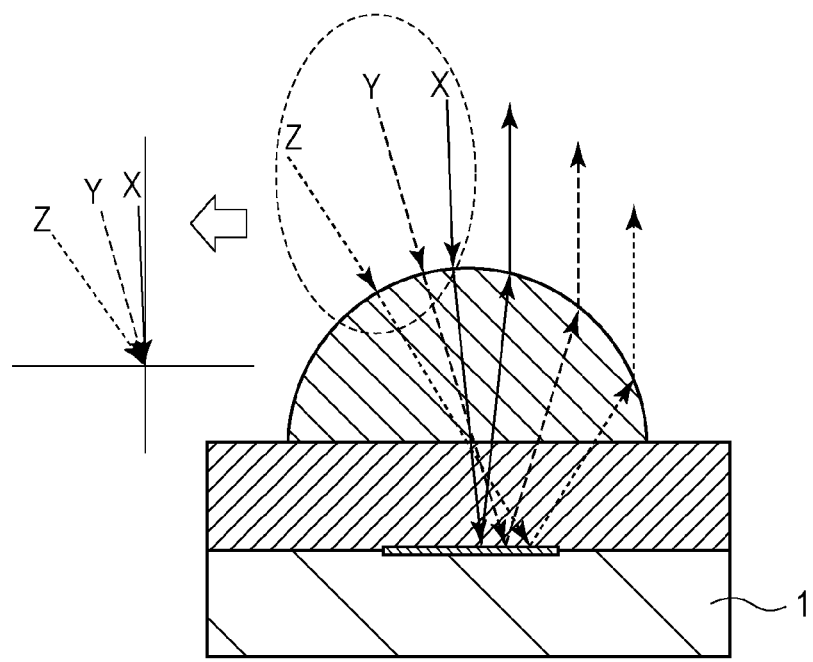
FIG. 3 schematically illustrates paths of external light entering the display device having a micro-lens array at various angles.

With regard to external light that is reflected within the display device equipped with the lenses 9 and is emitted to the front of the display device, specifically, external light that is emitted outward in the normal direction of the substrate 1, the relationship between the incident angle thereof on the substrate 1 and the degree of quenching by the circular polarization member 10 will now be discussed. FIG. 3 illustrates how external light beams incident on the substrate 1 at various angles are reflected within the display device and are refracted by one of the lenses 9 before being emitted outward in the normal direction. Reference characters X, Y, and Z denote simplified paths of light beams that are emitted from near areas of the lens 9 with 0°, 30°, and 45° inclination angles, respectively, and that are subsequently emitted outward from the display device in the normal direction.

The light beam X emitted from an area with a small inclination angle in the lens 9 has both a small incident angle and a small emission angle relative to the substrate 1. Because the light beam Y and the light beam Z that are emitted from areas with relatively large inclination angles in the lens 9 each have a large incident angle on the substrate 1 and are also refracted by the lens 9 by a large angle, the light beams are emitted in the normal direction.

External light, like the light beam X, which enters the display device substantially in the normal direction of the substrate 1 can be substantially quenched by the circular polarization member 10 since the light travels through the circular polarization member 10 in the normal direction even after the light is reflected within the display device. In contrast, with regard to external light with a large incident angle on the substrate 1, like the light beam Y and the light beam Z, the proportion of non-circularly-polarized light increases with increasing incident angle, resulting in an increase in light that cannot be quenched by the circular polarization member 10. Moreover, of the external light emitted to the front, external light passing through areas with large inclination angles in the lens 9 cannot be quenched by the circular polarization member 10, causing deterioration in legibility in the front direction.

Hence, an optical absorption layer may be provided so as to block the light that enters the display device at a large incident angle on the substrate 1 and that is emitted via an area with the maximum inclination angle in the lens 9. The path of light entering the display device at a large incident angle and emitted outward in the normal direction of the substrate 1 from the area with the maximum inclination angle in the lens 9 is equivalent to the path of light entering the display device in the normal direction of the substrate 1 via the area with the maximum inclination angle in the lens 9. Therefore, the optical absorption layer 7 may at least be provided at a position where it can block the light entering the display device in the normal direction of the substrate 1 via the area with the maximum inclination angle in the lens 9. FIG. 2B illustrates paths of external light entering a display device formed by adding the optical absorption layer 7 according to the embodiment of the present invention to the configuration in FIG. 2A. In FIG. 2B, because the optical absorption layer 7 is provided so as to block the light entering the display device in the normal direction of the substrate 1 via the area with the maximum inclination angle in the lens 9, the light beam B that cannot be quenched by the circular polarization member 10 is absorbed by the optical absorption layer 7 so as to be prevented from being emitted outward. By providing the optical absorption layer 7 between the lenses 9 and a reflective surface formed in the same layer as the first electrodes, reflected light that causes poor legibility can be reduced.

The optical absorption layer 7 is preferably provided with openings so that light (luminescent light) generated by the light-emitting elements can be emitted outward without being blocked as much as possible.

In detail, the openings are provided in the optical absorption layer 7 such that light generated at the edges of the light-emitting areas of the light-emitting elements and emitted outward via the edges of the lenses 9 is prevented from being blocked. The optical absorption layer 7 provided in this manner allows the light generated by the light-emitting elements to be emitted outward via the lenses 9 without hindrance, and can also reduce reflected external light entering the display device and emitted outward therefrom after being reflected at the reflective surfaces of the first electrodes 2 within the light-emitting elements.

The advantages of the optical absorption layer 7 are studied by fabricating multiple samples of display devices. Each sample is a display device that includes an optical absorption layer with an optical absorptance of substantially 100% and having circular openings, and the size of each sub-pixel is 3000 μm². Moreover, the samples have different diameters for the openings in the optical absorption layers, which are 0 μm, 25 μm, 30 μm, 35 μm, and 40 μm. In each of the samples, the light-emitting areas each have a circular shape with an 8-μm diameter, the partition layer 3 has a thickness of 1 μm, the protection layer 6 (with a refractive index of 1.96) has a thickness of 5 μm, the optical absorption layer 7 has a thickness of 1 μm, and the undercoating layer 8 (with a refractive index of 1.55) has a thickness of 3.5 μm. Furthermore, each of the lenses 9 (with a refractive index of 1.68) has a diameter of 39.95 μm, a height of 19 μm, and a curvature radius of 20 μm. The refractive indices in parentheses all indicate values at a wavelength of 550 nm.

Figure 4A:
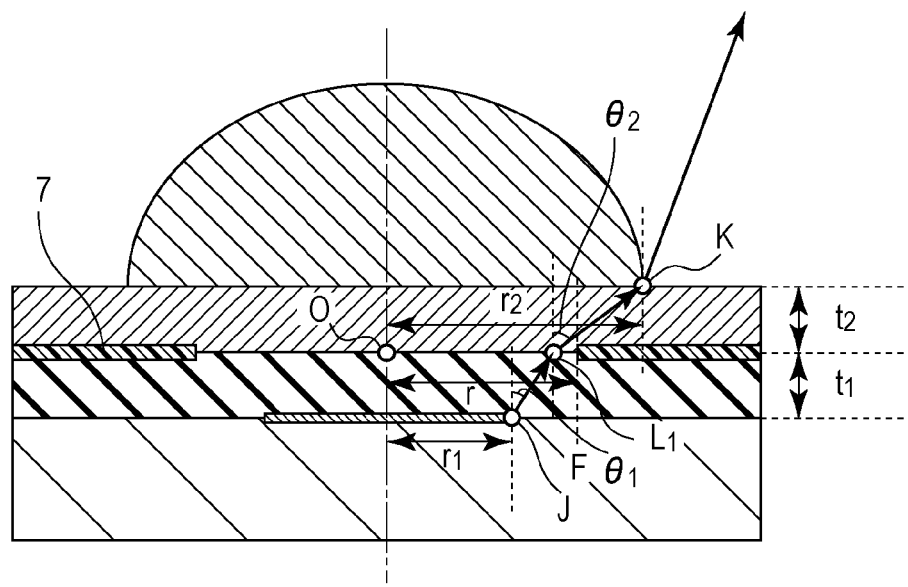
FIGS. 4A and 4B are schematic cross-sectional views of a light-emitting element, explaining how an edge of each opening in the optical absorption layer is designed.
Figure 4B:
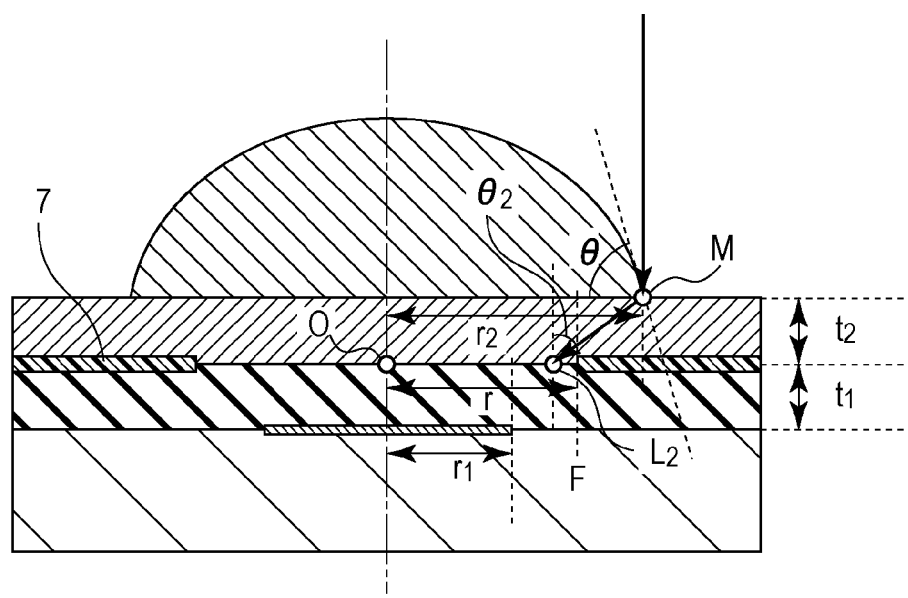

The following description relates to how an edge of each opening in the optical absorption layer 7 is designed with reference to FIGS. 4A and 4B, which are schematic cross-sectional views of each of the light-emitting elements. In FIGS. 4A and 4B, the thickness of the partition layer 3 is added to the thickness of the protection layer 6, and the thickness of the optical absorption layer 7 is added to the thickness of the undercoating layer 8.

First, a design example of an edge F of each opening made in view of a path of light generated at the edge of the light-emitting area of the corresponding light-emitting element and emitted outward via an edge of the corresponding lens 9 will be described with reference to FIG. 4A. Since a precise calculation of the light path involves extremely complicated equations due to the effect of aberrations in the lens 9, a light beam emitted from an edge J of the light-emitting area and passing through a nearest edge K of the lens 9 will be used as an approximation.

The following three equations can be derived from the relationship in FIG. 4A and Snell's law.

$$\theta_1 = a\tan\frac{r_{min} - r_1}{t_1} \quad (1)$$

$$\theta_2 = a\tan\frac{r_2 - r_{min}}{t_2} \quad (2)$$

$$n_1 \sin\theta_1 = n_2 \sin\theta_2 \quad (3)$$

In the equations, $r_1$ denotes the radius of the light-emitting element, $r_2$ denotes the radius of the lens 9, $n_1$ denotes the refractive index of the protection layer 6, $n_2$ denotes the refractive index of the undercoating layer 8, $t_1$ denotes the total thickness of the protection layer 6 and the partition layer 3, $t_2$ denotes the total thickness of the undercoating layer 8 and the optical absorption layer 7, $\theta_1$ denotes an angle at which the light beam emitted from the edge J of the light-emitting area and traveling via the edge K of the lens 9 passes through the protection layer 6, and $\theta_2$ denotes an angle at which the light beam passes through the undercoating layer 8.

In Equations (1) to (3), $r_{min}$ denotes a distance between a point L1 on an optical-absorption-layer formation surface, through which the light generated at the edge J of the light-emitting area of the light-emitting element passes before being emitted outward via the edge K of the lens 9, and a center O of the opening in the optical absorption layer 7. Specifically, by setting a minimum distance r (i.e., radius of the opening if the opening is circular) between the center O of the opening in the optical absorption layer 7 and each point at the edge F of the opening to a value larger than $r_{min}$, the optical absorption layer 7 can be provided such that the light generated by the light-emitting element can be emitted outward from the display device without hindrance.

Next, a calculation example of the edge F of each opening made in view of a path of light entering the display device in the normal direction of the substrate 1 via the area with the maximum inclination angle in the lens 9 will be described with reference to FIG. 4B. Similar to FIG. 4A, a distance $r_{max}$ between a point L2 on the optical-absorption-layer formation surface, through which the light entering the display device via an area M with the maximum inclination angle in the lens 9 passes, and the center O of the opening in the optical absorption layer 7 is expressed by the following two equations based on the relationship in FIG. 4B and Snell's law.

$$\theta_2 = \sin^{-1}\frac{n_3}{n_2}\sin\left(\theta - \sin^{-1}\frac{n_4}{n_3}\sin\theta\right) \quad (4)$$

$$r_{max} = r_2 - t_2\tan\theta_2 \quad (5)$$

In this case, $n_3$ denotes the refractive index of the lens 9, $n_4$ denotes the refractive index of the outside (i.e., outside the lens 9), and θ denotes the inclination angle of the lens 9 at the edge of the lens 9. By substituting respective values into the two equations above, $r_{max}$ can be calculated. By setting the minimum distance r (i.e., radius of the opening if the opening is circular) between the center O of the opening in the optical absorption layer 7 and each point at the edge F of the opening to be smaller than $r_{max}$, the light entering the display device in the normal direction of the substrate 1 via the area with the maximum inclination angle in the lens 9 can be blocked and absorbed. Depending on the shape of the lens 9, there is a case where $r_{max} < r_{min}$ due to aberrations in the lens 9. In that case, the radius of the opening in the optical absorption layer 7 may be set such that $r_{min} < r$.

Accordingly, in this embodiment of the present invention, the minimum distance r between the center O of the opening in the optical absorption layer 7 and each point at the edge F of the opening is preferably designed such that $r_{mix} < r$ or $r_{mix} < r < r_{max}$. By substituting respective parameter values in the fabricated samples into Equations (1) to (5) above, $r_{min} = 10.2$ μm and $r_{max} = 14.8$ μm are obtained.

Figure 5:
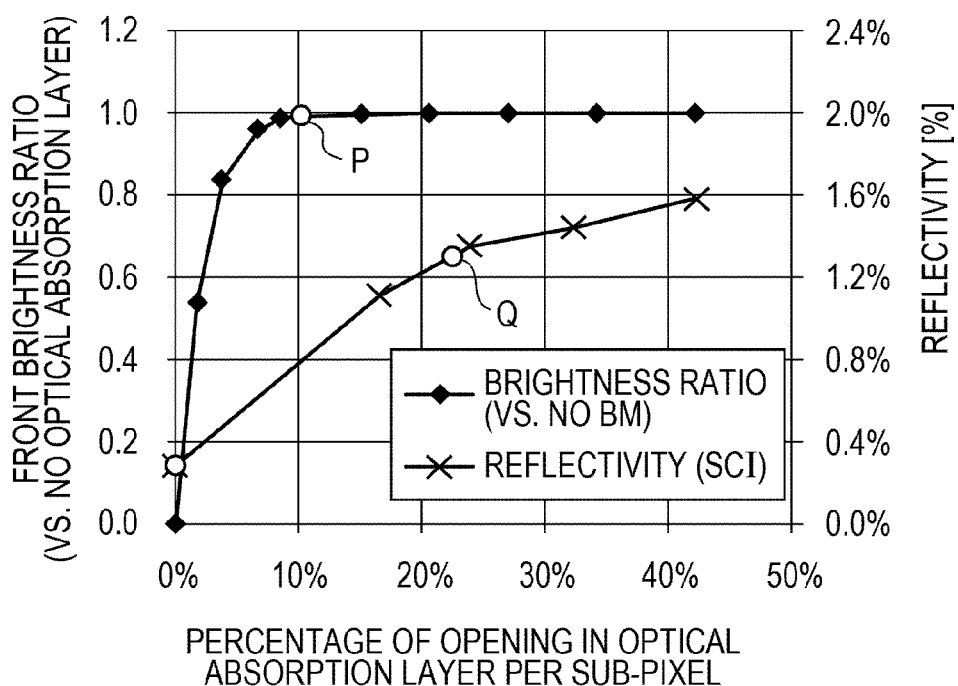
FIG. 5 illustrates the relationship between reflectivity and front brightness ratio in the display device provided with the optical absorption layer having circular openings.

FIG. 5 illustrates measured reflectivity values for each sample. FIG. 5 also shows simulation values indicating ratios (front brightness ratios) between the front brightness of multiple models, with configurations similar to that of the fabricated samples and having different sizes for the openings in the optical absorption layer 7 within a diameter range of 25 μm to 40 μm, and the front brightness of a display device model that is not provided with an optical absorption layer.

The horizontal axis denotes the percentage of area occupied by the opening in the optical absorption layer 7 with respect to one sub-pixel size. By converting the diameter values 0 μm, 25 μm, 30 μm, 35 μm, and 40 μm of the opening in the optical absorption layer 7 to the percentage of area occupied by the opening in the optical absorption layer 7 with respect to one sub-pixel size, 0%, 16%, 23.6%, 32%, and 42% are obtained, respectively. The scale provided at the left vertical axis denotes the front brightness ratio, which is a value obtained by dividing the front brightness of a display device provided with the optical absorption layer 7 by the front brightness of a display device not provided with an optical absorption layer. The scale provided at the right vertical axis denotes reflectivity, which indicates the percentage of light, of the external light entering the display device, that is reflected within the display device and emitted outward.

Figure 6:
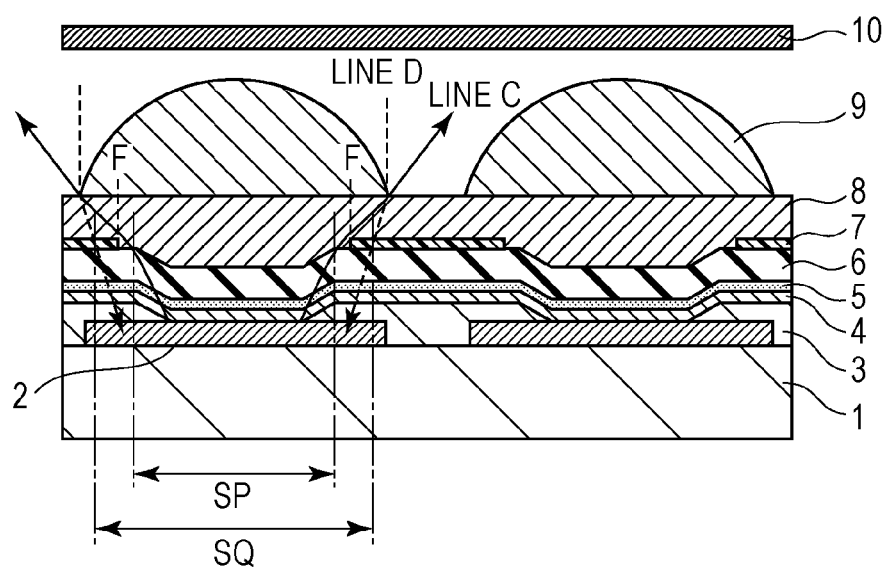
FIG. 6 schematically illustrates an area where the optical absorption layer is provided.

As is apparent from FIG. 5, the front brightness ratio and the reflectivity both tend to decrease with decreasing size of the opening in the optical absorption layer 7. A horizontal-axis value corresponding to a point P where the front brightness ratio drastically decreases substantially matches 10.4%, which is the percentage of area occupied by the opening when $r_{min} = 10.2$ μm calculated above. FIG. 6 shows a line C denoting a light beam generated at the edge of the light-emitting area of the light-emitting element and emitted outward via the edge of the lens 9. By providing the edge F of the opening of the optical absorption layer 7 outside the line C (for example, outside a region SP) such that this line C extends within the opening of the optical absorption layer 7, the reflectivity can be reduced while the light generated by the light-emitting element can be emitted outward without hindrance.

A horizontal-axis value corresponding to a point Q where the decreasing rate of the reflectivity increases in FIG. 5 substantially matches 22.9%, which is the percentage of area occupied by the opening when $r_{max} = 14.8$ μm. FIG. 6 shows a line D denoting a light beam entering the display device in the normal direction of the substrate 1 via the area with the maximum inclination angle in the lens 9. By providing the edge F of the opening of the optical absorption layer 7 inside the line D (for example, inside a region SQ) such that this line D extends outside the opening of the optical absorption layer 7, the reflectivity can be efficiently reduced.

Accordingly, the edge F of the opening in the optical absorption layer 7 is preferably provided outside the line C in FIG. 6 and inside the line D (i.e., toward the light-emitting element). Specifically, the edge F of the opening in the optical absorption layer 7 is disposed between the lens 9 and the first electrode 2, and is most preferably located where the edge F does not block the light generated by the light-emitting element and emitted outward via the edge of the lens 9 but blocks the light entering the display device in the normal direction of the substrate 1 via the area with the maximum inclination angle in the lens 9. It is apprehensible from Equations (1) to (5) that the size and the positioning of the opening in the optical absorption layer 7 can be designed by using values, such as the refractive indices and the thicknesses of the various materials constituting the display device, and the diameter and the curvature radius of the lens 9. The opening in the optical absorption layer 7 does not necessarily need to be circular and may be appropriately designed in accordance with the shape of the light-emitting area and the lens. The refractive indices of the various materials constituting the display device may vary depending on film-formation conditions, such as the composition and the film densities. For example, in a case where silicon nitride is used, which is suitable for the protection layer 6, the refractive index is known to vary within a range between 1.75 and 2.00 relative to light with a wavelength of 550 nm. For the refractive index of a film used for designing each opening in the optical absorption layer 7, a calculated refractive index obtained by forming a single-layer film on a glass substrate and measuring the reflectivity of the film may be employed. Alternatively, the relationship between the properties, such as the composition and the density of the film, and the refractive index may be studied in advance so that a refractive index determined from measured values of the composition and the density of the film may be employed. As a further alternative, by using electron energy loss spectroscopy using an electron microscope (TEM-ELLS), the multiple kinds of films constituting the display device may be collectively stacked on the substrate so that a refractive index calculated from a nano-level cross-sectional region of each film may be employed.

Although a method for manufacturing the display device according to the embodiment of the present invention will be described below with reference to FIGS. 7A to 7H, a known manufacturing process may be appropriately applied.

FIGS. 7A to 7H are schematic cross-sectional views showing steps for manufacturing the display device according to this embodiment. First, referring to FIG. 7A, multiple top-emission-type organic EL elements are formed on a semiconductor substrate 1 composed of silicon or on a substrate 1 having an insulating surface composed of glass or resin and provided with an active-matrix driving circuit formed thereon by a known method. The organic EL elements are formed by stacking anode electrodes 2 as first electrodes, a partition layer 3, an organic compound layer 4, and a cathode electrode 5 as a second electrode in that order from the substrate 1. Each first electrode is electrically connected to the driving circuit (not shown) via a contact hole in an interlayer dielectric film and a planarizing film (not shown) provided in the substrate 1.

Next, a protection layer 6 is formed so as to cover at least the entire display region where the organic EL elements are disposed. The protection layer 6 is provided for preventing moisture from entering the organic EL elements. It is preferable that the protection layer 6 have a high optical transmittance of 90% or higher and be composed of a material with high moisture resistance. Although the protection layer 6 has a surface that conforms to the shape of the cathode electrode 5 in FIG. 7A, the protection layer 6 may alternatively have a flat surface.

Subsequently, referring to FIG. 7B, an optical absorption layer 7 is formed over the protection layer 6 so as to cover the entire display region. For the optical absorption layer 7, a material with an optical absorbance of 90% or higher is preferably used, or more preferably, a material with an optical absorbance of 95% or higher is used. In detail, a black resist containing a photosensitive binder that cures by receiving light and a black colorant is suitable for the optical absorption layer 7. The optical absorption layer 7 preferably has a thickness ranging between 10 nm and 10 µm so that sufficient optical absorbance can be obtained.

Figure 7A:
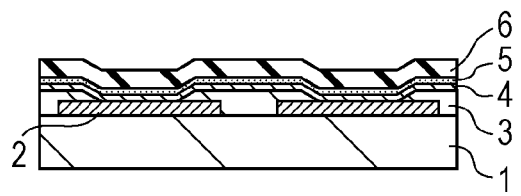
FIGS. 7A to 7H illustrate steps for manufacturing the display device according to the embodiment of the present invention.
Figure 7E:
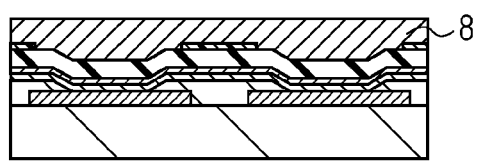
Figure 7B:
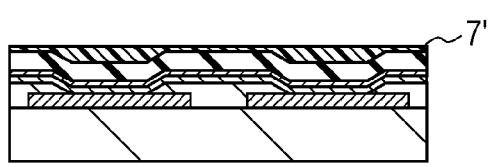
Figure 7F:
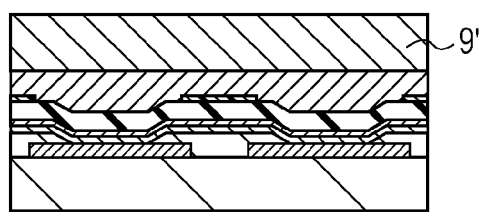
Figure 7C:
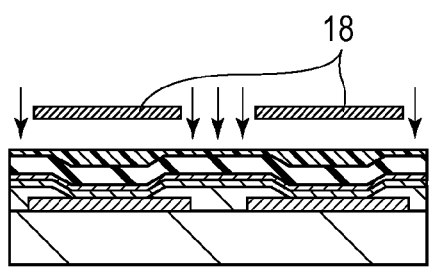
Figure 7G:
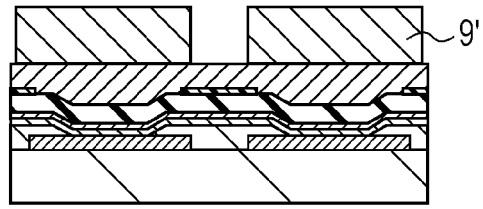
Figure 7D:
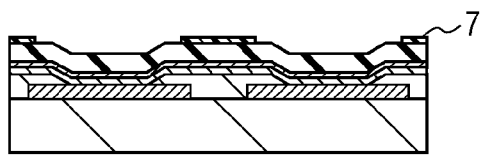
Figure 7H:
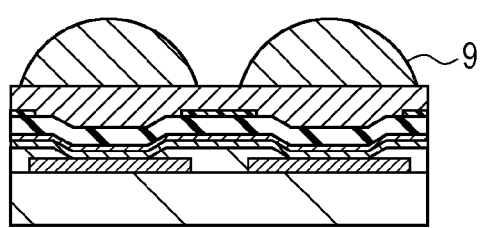

After forming the black resist entirely over the display region by spin coating, the black resist in areas where the optical absorption layer 7 is to be left in place is exposed to light by using a photo-mask 18, and a developing process is subsequently performed, as shown in FIG. 7C, thereby forming openings in the optical absorption layer 7, as shown in FIG. 7D. Alternatively, the openings in the optical absorption layer 7 may be formed by a dispensing method or a printing method. Subsequently, an undercoating layer 8 is formed over the entire display region, as shown in FIG. 7E. The undercoating layer 8 is provided for uniformizing the wettability between a lens-array formation surface and a lens material 9', and also has a function for adjusting the optical distance between the lens array and the light-emitting layer. For adjusting the optical distance, the undercoating layer 8 is formed to a thickness ranging between 10 nm and 100 µm.

Subsequently, a lens material layer 9' is formed over the entire display region and is patterned into a cylindrical shape above the organic EL elements by lithography, as shown in FIGS. 7F and 7G. Then, the lens material layer 9' is melted and deformed into a desired lens shape by heating and is subsequently cured, thereby forming an array of convex lenses at the light emission side. The lens array may be formed by other known methods, such as pressing a mold against a resin layer having a uniform thickness or exposing the resin layer to light distributed in the in-plane direction. The lens array is composed of a material with a visible-light transmittance of 90% or higher, more preferably, 95% or higher, such as epoxy resin or acrylic resin. The adjacent lenses do not necessarily need to be spaced apart from each other. Moreover, the height of the lenses is preferably 100 µm for preventing attenuation of light quantity caused by absorption.

Figure 8:
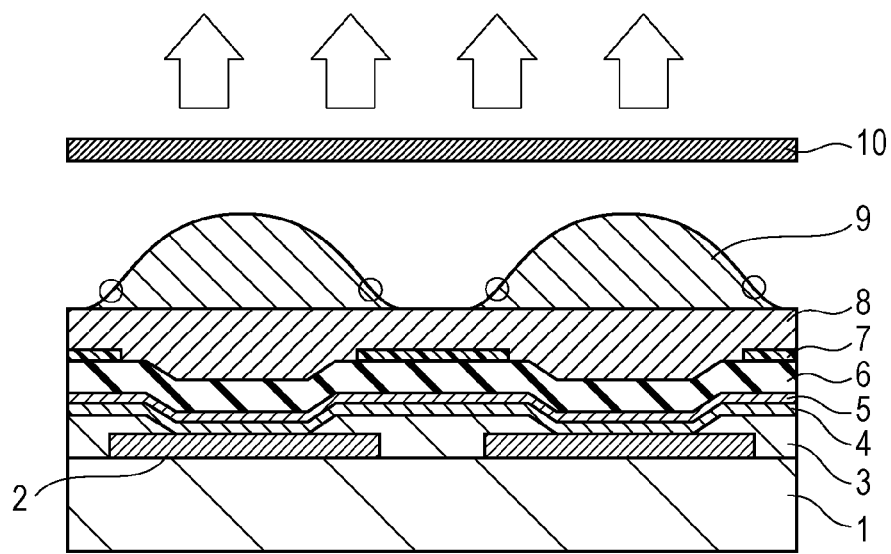
FIG. 8 is a schematic cross-sectional view for explaining an embodiment of the present invention.
Figure 9:
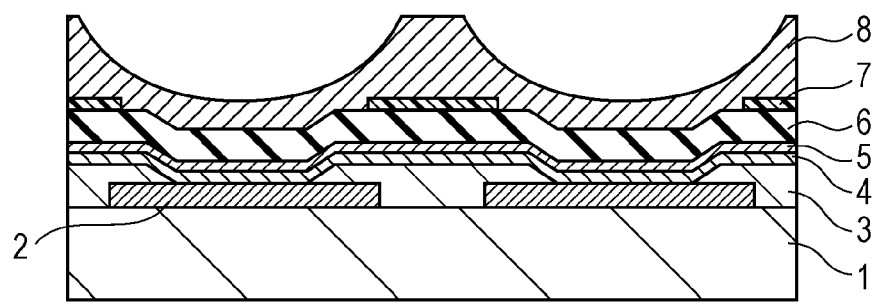
FIG. 9 is a schematic cross-sectional view for explaining an embodiment of the present invention.

For each of the lenses 9 in the present invention, a lens with different curvature radii for the center and the edge may be suitably used, as shown in FIG. 8. In each of the lenses 9 shown in FIG. 8, an area with the maximum inclination angle is located near an inflection point of the lens surface. The areas with the maximum inclination angle in the lenses 9 in FIG. 8 are denoted by circles. In addition to the spherical shape and the shape shown in FIG. 8, the lens shape may be a circular truncated cone shape or a cylindrical shape. With any of these lens shapes, reflection of external light can be effectively suppressed by providing an optical absorption layer in a similar manner to the lens configuration shown in FIGS. 7A to 7H. As an alternative to the convex lenses having a light collecting function provided at the light emission side, as in FIGS. 7A to 7H, the present invention can be applied to a case where concave lenses having a light scattering function are provided at the light emission side, as shown in FIG. 9.

Figure 10:
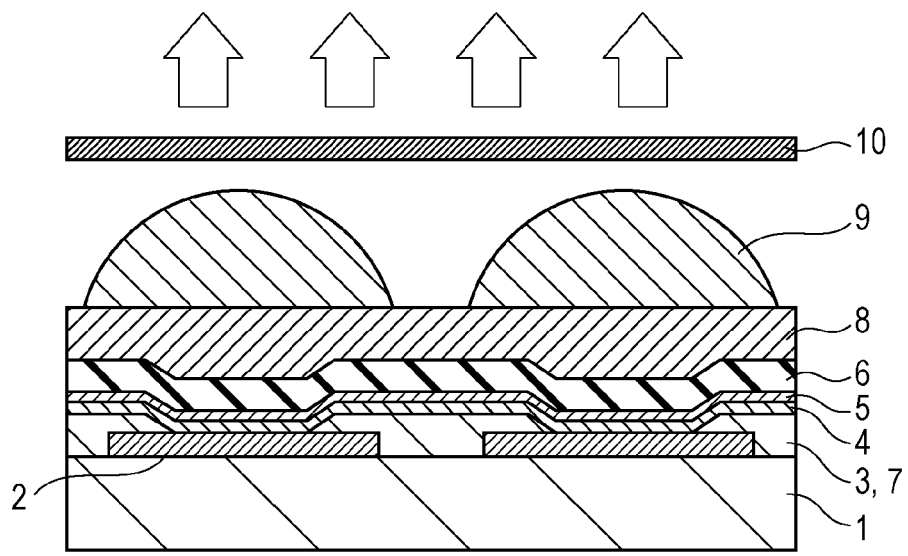
FIG. 10 is a schematic cross-sectional view of a display device according to another embodiment of the present invention.
Figure 11:
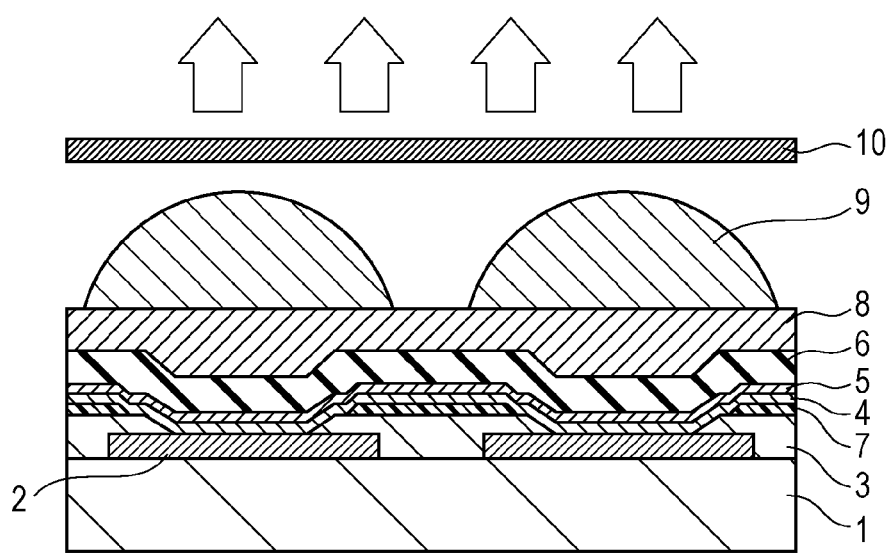
FIG. 11 is a schematic cross-sectional view of a display device according to another embodiment of the present invention.

Although the display device fabricated as the result of the manufacturing process in FIGS. 7A to 7H is provided with the optical absorption layer 7 at a position in contact with the surface of the protection layer 6, an alternative configuration shown in FIG. 10 in which the partition layer 3 is composed of a material with an optical transmittance similar to that of the low-optical-transmittance material used for the aforementioned optical absorption layer 7 is also preferable. Since this configuration eliminates the need to fabricate the optical absorption layer 7 in another layer, the manufacturing process can be simplified, and the material costs can also be reduced. As a further alternative, the optical absorption layer 7 may be provided between the partition layer 3 and the organic compound layer 4, as shown in FIG. 11.

Figure 12:
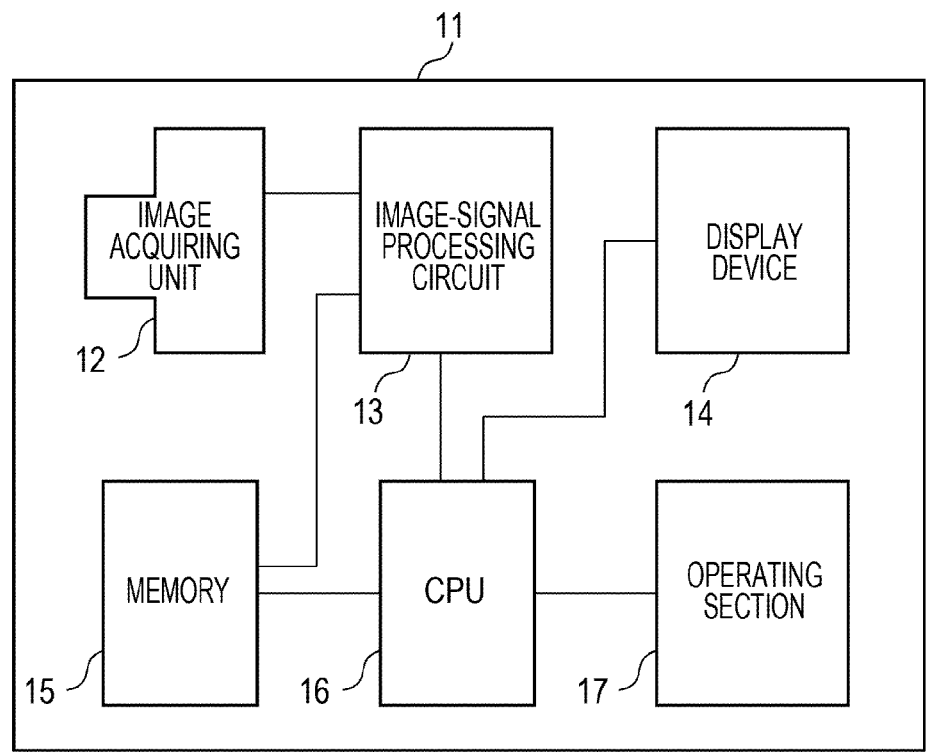
FIG. 12 illustrates an image-information processing apparatus equipped with the display device according to the present invention.
Figure 13:
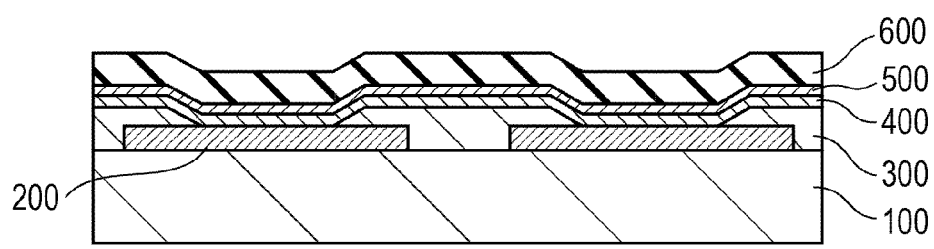
FIG. 13 is a partial cross-sectional view of a display device in the related art.

The display device according to the present invention is suitable for use in mobile devices, such as a rear monitor of a digital camera or a display for a mobile phone, for which enhanced legibility by high brightness display is important in an environment where external light is intense, such as outdoors. An example in which the display device according to the present invention is used in an image-information processing apparatus will be described below. FIG. 12 is a block diagram of a digital still camera system serving as the image-information processing apparatus to which the present invention is applied. In FIG. 12, reference numeral 11 denotes a digital still camera system, 12 denotes an image acquiring unit, 13 denotes an image-signal processing circuit, 14 denotes the display device according to the present invention, 15 denotes a memory, 16 denotes a central processing unit (CPU), and 17 denotes an operating section.

In FIG. 12, an image acquired by the image acquiring unit 12 or image information stored in the memory 15 is signal-processed by the image-signal processing circuit 13 so that an image signal is generated, whereby the image can be displayed on the display device 14. A controller includes the CPU 16 that controls the image acquiring unit 12, the memory 15, and the image-signal processing circuit 13 based on an input from the operating section 17, and performs image acquisition, recording, reproduction, or display appropriate for the conditions. Furthermore, the display device 14 can also be used as displays in other types of image-information processing apparatuses, and is suitable for use in portable electronic apparatuses that are frequently used outdoors.

The present invention is not limited to the above-described configurations and permits various applications and modifications so long as they do not depart from the spirit of the invention described above.

EXAMPLES

First Example

In this example, the display device shown in FIG. 1 is fabricated. The circuit substrate shown in FIG. 7A is fabricated by forming a pixel circuit (not shown) composed of low-temperature polysilicon TFT over a glass substrate 1, and then forming an interlayer dielectric film composed of silicon nitride (SIN) and a planarizing film composed of acrylic resin in that order over the pixel circuit. An indium tin oxide (ITO) film having a thickness of 38 nm and an aluminum-neodymium (AlNd) film having a thickness of 100 nm are formed in that order over the circuit substrate by sputtering. Subsequently, the ITO film and the AlNd film are patterned in a pixel-by-pixel fashion so that multiple anode electrodes 2 are formed.

Acrylic resin is spin-coated over the anode electrodes 2 and is pre-baked. The thickness of the pre-baked acrylic resin layer is 1 µm. Then, the acrylic resin layer is patterned by lithography so that openings are formed in areas where the anode electrodes 2 are formed. The acrylic resin layer is cured by post-baking, thereby forming a partition layer 3. These openings correspond to light-emitting areas of organic EL elements.

The openings in the partition layer 3 are arranged at a pitch of 60 µm, and the areas of the anode electrodes 2 exposed by the openings each have a diameter of 8 µm. After ultrasonically cleaning the substrate having the layers formed thereon including the partition layer 3 by using isopropyl alcohol (IPA), the substrate is cleaned by a boiling treatment and is subsequently dried. Furthermore, after cleaning the substrate by UV/ozone, an organic compound layer 4 is formed thereon by vacuum deposition.

The organic compound layer 4 is formed as follows. First, a hole transport layer shared by all sub-pixels is formed by depositing α-NPD to a thickness of 87 nm by vacuum deposition. During the deposition process, the degree of vacuum is $1 \times 10^{-4}$ Pa, and the deposition rate is 0.2 nm/sec. Then, a red-light-emitting layer, a green-light-emitting layer, and a blue-light-emitting layer are formed to thicknesses of 30 nm, 40 nm, and 25 nm, respectively, in accordance with the sub-pixels by using a shadow mask having openings corresponding to the light-emitting areas, that is, the exposed areas of the anode electrodes 2. Subsequently, an electron transport layer shared by all sub-pixels is formed by depositing bathophenanthroline (Bphen) to a thickness of 10 nm by vacuum deposition. During the deposition process, the degree of vacuum is $1 \times 10^{-4}$ Pa, and the deposition rate is 0.2 nm/sec. Then, an electron injection layer shared by all sub-pixels is formed by depositing Bphen and $Cs_2Co_3$ to a thickness of 40 nm by co-evaporation (weight ratio of 90:10). During the deposition process, the degree of vacuum is $3 \times 10^{-4}$ Pa, and the deposition rate is 0.2 nm/sec.

The substrate provided with the organic compound layer 4 is moved to a sputtering device while maintaining the vacuum environment. With the sputtering device, a 10-nm-thick ultrathin Ag layer as a cathode electrode 5 and a 50-nm-thick transparent electrode layer composed of a mixture of indium oxide and zinc oxide are formed in that order, thereby forming a light-emitting-element array having multiple light-emitting elements arranged on the substrate.

Subsequently, a protection layer 6 composed of silicon nitride is formed to a thickness of 5 µm by a plasma chemical-vapor-deposition (CVD) method using $SiH_4$ gas, $N_2$ gas, and $H_2$ gas (see FIG. 7A). The refractive index of the protection layer 6 is 1.96.

The substrate having the layers formed thereon including the protection layer 6 is taken out into open air, and a black resist formed of carbon particles dispersed in photosensitive resin is applied over the entire protection layer 6 by using a spin coater and is prebaked (see FIG. 7B). The film thickness in this case is 1 µm. Subsequently, after aligning a photo-mask having 25-µm-diameter dots arranged at a pitch of 60 µm, the black resist layer is exposed to light and is developed. Then, the black resist layer is post-baked and cured, whereby an optical absorption layer 7 having openings is formed (see FIGS. 7C and 7D).

Subsequently, ultraviolet curable resin with 2000 mPa·s viscosity and a refractive index of 1.55 at 550-nm wavelength is applied by using the spin coater. Then, the ultraviolet curable resin is exposed to light and is cured, thereby forming an undercoating layer 8 having a thickness of 3.5 µm (see FIG. 7E).

Then, in a nitrogen atmosphere with a 60° C. dew-point temperature, a thermosetting resin material (epoxy resin) with 3000 mPa·s viscosity and a refractive index of 1.68 at 550-nm wavelength is applied by using the spin coater. The thermosetting resin material is subsequently pre-baked, thereby forming a 16-µm-thick lens material layer 9' over the entire display region (see FIG. 7F). Then, the lens material layer 9' is patterned by photolithography so that 40-µm-diameter cylinders formed of the lens material layer 9' are formed above the respective organic EL elements (see FIG. 7G). The lens material layer 9' is then melted and deformed into a desired lens shape by heating and is subsequently cured, thereby forming convex lenses at the light emission side. Each lens has a diameter of 39.95 µm, a height of 19 µm, and a curvature radius of 20 µm.

For determining the size of each opening in the optical absorption layer 7 in this example, a minimum radius of the opening is calculated by substituting numerical values of the respective materials in this example into Equations (1) to (3) described above, and a maximum radius is calculated by substituting numerical values of the respective materials in this example into Equations (4) and (5) described above. As a result, with the configuration in this example, a preferred range for the radius r of each opening in the optical absorption layer 7 is as follows: 10.2 µm<r<14.8 µm. In diameters, 20.4 µm<2r<29.6 µm. In this example, each opening is given a diameter of 25 µm to satisfy this condition.

The front brightness and the reflectivity are evaluated by providing a circular polarization member (not shown), having a phase difference member and a linear polarization member stacked in that order from the lens array side, in parallel to the substrate at the light emission side of the organic EL display device fabricated in this manner. The evaluation is performed by fabricating an organic EL display device that is similar to that in the first example except for that the diameter of the optical absorption layer 7 is 40 µm, which is outside the preferred range in the present invention, and then displaying and comparing identical images. The display device according to the first example achieves a front brightness similar to that in the comparative example, but advantageously achieves a reduced reflectivity of external light at 0.5%, as compared with that in the display device according to the comparative example, which is 1.6%.

Second Example

In this example, the display device shown in FIG. 11 is fabricated. The manufacturing method is similar to that in the first example except for that the optical absorption layer 7 is formed after forming the partition layer 3 and before forming the organic EL layer.

After forming the partition layer 3 in a similar manner to the first example, a black resist composed of the same material used for forming the optical absorption layer 7 in the first example is applied by using a spin coater and is pre-baked. The film thickness in this case is 1 μm. Then, by using a photo-mask having 15-μm-diameter dots arranged at a pitch of 60 μm, the black resist layer is exposed to light and is developed, and is subsequently cured. Since the subsequent steps are the same as those in the first example, descriptions thereof will be omitted.

For determining the size of each opening in the optical absorption layer 7 in this example, the size is calculated in a similar manner to the first example except for the thickness of the optical absorption layer 7 is added to the protection layer 6. Based on Equations (1) to (5), a preferred range for the radius r of each opening in the optical absorption layer 7 is as follows: 4 μm<r<11.5 μm. In diameters, 8 μm<2r<23 μm. In this example, each opening in the optical absorption layer 7 is given a diameter of 15 μm to satisfy this condition.

Similar to the first example, the organic EL display device fabricated in this manner is compared with an organic EL display device fabricated in the same manner as this example except for that the diameter of the optical absorption layer 7 is 30 μm, which is outside the preferred range in the present invention. The result obtained is similar to the first example in that the front brightness of the display device according to this example is similar to that in the comparative example, but advantageously achieves reduced reflectivity, as compared with that in the comparative example.

Third Example

Unlike the first example, the optical absorption layer is formed as in FIG. 10. Since the steps up to the formation of the lenses 9 are similar to those in the first example except for that the partition layer 3 is formed by using a black resist and that the optical absorption layer 7 is not provided, descriptions thereof will be omitted. Because the partition layer 3 serves as an optical absorption layer in this example, each light-emitting area has the same size as the corresponding opening in the optical absorption layer.

In this example, the lenses 9 are formed by embossing. First, in a nitrogen atmosphere with a 60° C. dew-point temperature, a thermosetting resin material (epoxy resin) with 3000 mPa·s viscosity and a refractive index of 1.68 is applied by using a precision-rendering dispenser (Product Name: SHOT MINI SL, Manufacturer: Musashi Engineering, Inc.). Then, before the resin material thermally cures, a mold for forming separately-provided lenses 17 is pressed against the surface of the resin material, as shown in FIG. 7G. When performing the pressing process, positioning is performed by aligning an alignment mark formed in the mold with an alignment mark formed in the substrate. As a result, lenses 9 are formed in alignment with the pixels. The mold has recesses arranged at the same pitch as the pixel pitch, and the surface of each recess is coated with Teflon (registered trademark) based resin as a mold releasing agent. The recesses, that is, the lenses 9, each have a diameter of 38 μm and a curvature radius of 20 μm.

With the mold pressed against the resin material (epoxy resin), the resin material is heated for 15 minutes at a temperature of 100° C. in a vacuum environment so as to be cured. Subsequently, the mold is released from the resin, whereby nearly hemispherical lenses 9 are formed. The height of the lens array is about 10 μm.

Similar to the first example, the organic EL display device fabricated in this manner is compared with an organic EL display device fabricated in the same manner as this example except for that the optical absorption layer is composed of the same transparent material used in the related art. The result obtained is similar to the first example in that the front brightness of the display device according to this example is similar to that in the comparative example, but advantageously achieves reduced reflectivity, as compared with the comparative example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-146516 filed Jun. 30, 2011, which is hereby incorporated by reference herein in its entirety.

What is claimed is:

1. A display device comprising:
   a light-emitting-element array including a plurality of light-emitting elements arranged on a substrate, each light-emitting element having a light-emitting layer disposed between a first electrode and a second electrode;
   a lens array provided at a light emission side of the light-emitting-element array and including a plurality of lenses arranged in correspondence with the plurality of light-emitting elements; and
   a circular polarization member at a light emission side of the lens array, wherein the circular polarization member includes a phase difference member and a linear polarization member in order from the lens array,
   wherein an optical absorption layer having a plurality of openings corresponding to the plurality of lenses is disposed between the lens array and the first electrode, and
   wherein an edge of each of the openings is provided such that light entering in a normal direction of the substrate and traveling through an area where the corresponding lens has a maximum inclination angle is blocked by the optical absorption layer.

2. The display device according to claim 1, further comprising a protection layer between the second electrode and the lenses,
   wherein the optical absorption layer is provided between the protection layer and the lens array.

3. The display device according to claim 1, wherein the optical absorption layer has an inclined portion that covers an edge of the first electrode and defines a light-emitting area of each light-emitting element.

4. The display device according to claim 1, wherein the light-emitting elements are organic electroluminescent elements.

5. The display device according to claim 1, wherein the second electrode is transparent.

6. An image-information processing apparatus comprising:
   a memory that stores image information;
   an image-signal processing circuit that generates an image signal by signal-processing the image information;
   a display device that receives the image signal and displays an image; and
   a central processing unit that controls the image-signal processing circuit and the display device,
   wherein the display device is the display device according to claim 1.

* * * * *